United States Patent
Rice et al.

[19]

[11] Patent Number: 5,917,387
[45] Date of Patent: Jun. 29, 1999

[54] FILTER HAVING TUNABLE CENTER FREQUENCY AND/OR TUNABLE BANDWIDTH

[75] Inventors: Christopher W. Rice, Parsippany; Harry R. Worstell, Chatham, both of N.J.

[73] Assignee: Lucent Technologies Inc., Murray Hill, N.J.

[21] Appl. No.: 08/722,544

[22] Filed: Sep. 27, 1996

[51] Int. Cl.⁶ ...................................................... H03H 7/00
[52] U.S. Cl. ............................................. 333/174; 333/175
[58] Field of Search ................................. 333/167, 168, 333/174, 175, 176, 202, 207, 235, 205, 177, 178

[56] References Cited

U.S. PATENT DOCUMENTS

| | | | |
|---|---|---|---|
| 1,568,144 | 1/1926 | Elsasser | 333/168 |
| 2,682,037 | 6/1954 | Bobis et al. | 333/175 X |
| 3,049,682 | 8/1962 | Waring | 333/174 |
| 3,110,004 | 11/1963 | Pope | 333/175 X |
| 3,530,408 | 9/1970 | Brandon et al. | 333/167 X |
| 3,794,938 | 2/1974 | Boelter | 333/168 |
| 4,876,739 | 10/1989 | Ma et al. | 333/175 X |
| 5,065,121 | 11/1991 | Ghadaksaz | 333/235 |

FOREIGN PATENT DOCUMENTS

| | | | |
|---|---|---|---|
| 0216515 | 9/1987 | Japan | 333/175 |
| 4-222107 | 8/1992 | Japan | 333/174 |

OTHER PUBLICATIONS

"A VHF Switched–Capacitor Band–Pass Filter Using GaAs MESFET IC Technology", P. Katzin, et al., 1993 IEEE GaAS IC Symposium, Oct. 10–13, 1993, San Jose, CA, pp. 243–245.

*Primary Examiner*—Seungsook Ham
*Attorney, Agent, or Firm*—Steven R. Bartholomew

[57] ABSTRACT

In an RF filter having an input terminal, an output terminal, a plurality of resonator elements, and a plurality of coupling reactances for coupling one resonator element to another resonator element, for coupling the input terminal to a resonator element, and for coupling the output terminal to a resonator element, techniques are disclosed for providing an RF filter having an electronically tunable center frequency and an electronically tunable bandwidth. According to a specific embodiment disclosed herein, a first shunt reactance is provided from the input terminal to ground, and a second shunt reactance is provided from the output terminal to ground. The values of the coupling reactances remain constant, while the values of the resonator elements, the first shunt reactance, and the second shunt reactance are tuned to provide a specified filter bandwidth and/or a specified center frequency. According to a further embodiment, such a tunable filter is fabricated on a physical substrate having a substantially constant dielectric constant per unit volume, and the coupling reactances include capacitors fabricated using the physical substrate.

28 Claims, 3 Drawing Sheets

FILTER HAVING TUNABLE CENTER FREQUENCY AND/OR TUNABLE BANDWIDTH

BACKGROUND

1. Field of the Invention

The invention relates generally to RF filters, and more specifically to RF filters with one or more adjustable characteristics.

2. Description of Related Art

State-of-the-art RF filters are commonly implemented through the use of a plurality of parallel-resonant LC sections that are capacitively coupled to the source, to the load, and to each other. In many applications, it would be desirable to provide a mechanism by which the center frequency and/or the bandwidth of such a filter may be adjusted. To this end, various techniques have been used to provide filters having tunable characteristics. In general, these techniques involve changing the reactance of one or more filter components. For example, many low-cost portable AM/FM radios use a mechanical multi-gang variable capacitor, in combination with fixed inductors, to provide tuning across the AM and FM broadcast bands.

Electronically-tunable filter designs incorporate varactor diodes into the parallel-resonant LC sections, and/or use varactor diodes to control the capacitive coupling elements of the filter. Varactor diodes may be conceptualized as voltage-controlled variable capacitors, because the capacitance provided by a varactor diode is roughly proportional to the reverse DC bias applied to the varactor diode. Varactor diodes have been used to make RF filters having tunable center frequencies and/or tunable bandwidth. In a typical filter arrangement providing for adjustment of center frequency, each parallel-resonant LC section of the filter includes a tuning element comprising one or more varactor diodes. The capacitance of the diodes is set to a desired value by adjusting a DC control voltage, thereby "tuning" the RF filter to a desired center frequency. In a typical filter arrangement providing for adjustment of bandwidth, one or more of the capacitive coupling elements of the filter includes a varactor diode for adjusting the amount of coupling between adjacent parallel-resonant sections of the filter, and/or for adjusting the coupling between the filter and a source/load element.

In many system applications, it would be desirable to minimize the number of varactor diodes that are used in an electronically-tunable filter while, at the same time, providing a filter having adjustable bandwidth and adjustable center frequency. In order to provide an electronically-tunable filter with these adjustable properties, prior art designs require the use of a first set of varactor diodes to adjust the bandwidth, and another set of varactor diodes to adjust the center frequency. Since varactor diodes add cost to a filter design, it is desirable to keep the number of varactor diodes in a filter design to a minimum.

As the number of varactor diodes in a filter is increased, it becomes increasingly difficult to properly align the filter. Since two varactor diodes will generally not exhibit identical voltage-versus-capacitance characteristics, tracking mechanisms are used to compensate for inherent device-to-device variations, such that, for example, all resonant elements will be tuned to the same frequency at a given varactor DC supply voltage. These tracking mechanisms typically take the form of variable trimmer capacitors and/or variable resistors (potentiometers). As the number of varactor diodes in a filter is increased, it becomes increasingly difficult and time-consuming to properly adjust filter tracking. For these reasons, it would be desirable to minimize the number of varactor diodes used in an adjustable filter design.

The capacitance provided by a varactor diode is linearly related to the applied reverse bias voltage only over a certain range of reverse bias voltages. Outside of this voltage range, the varactor diode exhibits nonlinear properties and provides a capacitance with an insufficiently high Q (i.e., the capacitance is swamped by too much series resistance). Even within the linear operating region of the varactor diode, the Q of a varactor diode is often lower than that of a conventional air-dielectric or mica-dielectric variable capacitor. If a filter design requires relatively high-Q elements, it may not be possible to achieve a desired level of performance with varactor diodes. In a similar vein, varactor diodes are more vulnerable to relatively high levels of applied RF energy than is the case with mechanical capacitors. When confronted with strong RF input signals, varactor diodes can introduce intermodulation and other spurious products into a filtered signal.

One technique for providing a tunable resonator element, while at the same time overcoming the disadvantages of varactor diodes, is described in U.S. Pat. No. 5,065,121 issued to Masood Ghadaksaz on Nov. 12, 1991 (hereinafter, Ghadaksaz). Ghadaksaz discloses a single resonator element that has a selectable center frequency. The center frequency is changed by electronically switching a plurality of fixed inductive and capacitive elements into a resonant circuit. However, Ghadasaz does not describe any mechanism for tuning the bandwidth of the resonator element, nor does Ghadasaz describe how a plurality of resonator elements could be combined with other reactive elements to form an RF filter. Therefore, there is a need for a tunable filter design which minimizes the number of tunable filter elements while providing a mechanism for adjusting center frequency and bandwidth.

SUMMARY OF THE INVENTION

In an RF filter having an input terminal, an output terminal, a plurality of resonator elements, and a plurality of coupling reactances for coupling one resonator element to another resonator element, for coupling the input terminal to a resonator element, and for coupling the output terminal to a resonator element, techniques are disclosed for providing an RF filter having an electronically tunable center frequency and/or an electronically tunable bandwidth. According to a specific embodiment disclosed herein, a first shunt reactance is provided from the input terminal to ground, and a second shunt reactance is provided from the output terminal to ground. The values of the coupling reactances remain constant, while the values of the resonator elements, the first shunt reactance, and the second shunt reactance are tuned to provide a specified filter bandwidth and/or a specified center frequency.

DETAILED DESCRIPTION OF THE PREFERRED EMBODIMENTS

Figure 1:
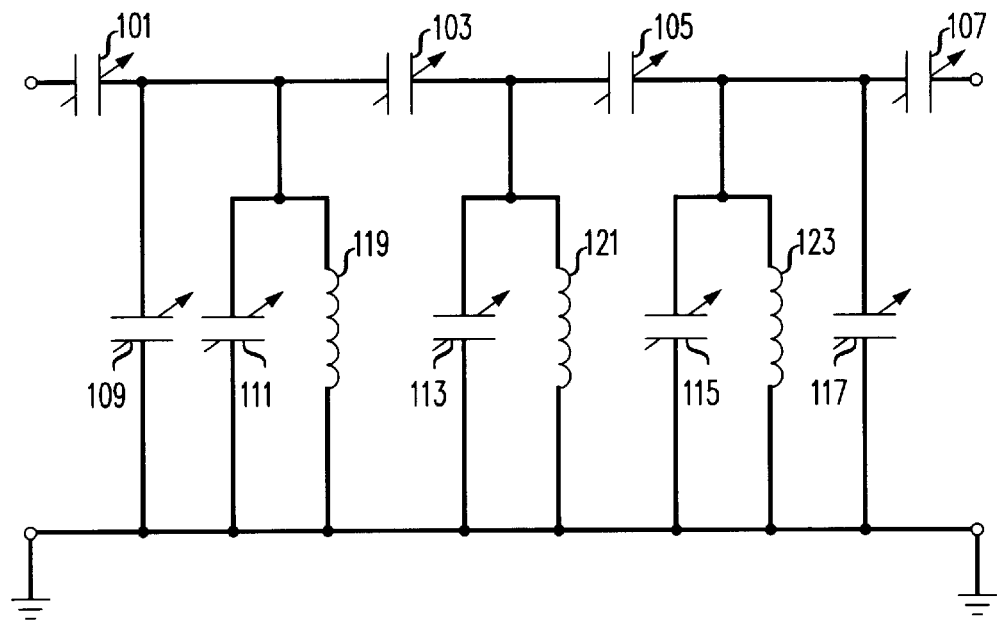
FIG. 1 is a schematic diagram of a prior-art capacitively-coupled, multi-resonator RF bandpass filter.

FIG. 1 is a schematic diagram of a prior-art capacitively-coupled, multi-resonator RF bandpass filter. The filter includes a first coupling capacitor 101 for coupling the filter to a source, a second coupling capacitor 107 for coupling the filter to a load, a first impedance transforming capacitor 109 for matching the impedance of the filter to the impedance of the source, and a second impedance transforming capacitor 117 for matching the impedance of the filter to the impedance of the load. A first resonator element includes capacitor 111 and inductor 119 connected in parallel, a second resonator element includes capacitor 113 and inductor 121 connected in parallel, and a third resonator element includes capacitor 115 and inductor 123 connected in parallel. A third coupling capacitor 103 couples the first resonator element to the second resonator element, and a fourth coupling capacitor 105 couples the second resonator element to the third resonator element.

Capacitors 101, 103, 105, 107, 109, 111, 113, 115, and 117 are shown as variable capacitors for purposes of illustration, to demonstrate that the values of these capacitors may have to be changed if it is desired to change the bandwidth and/or the center frequency of the filter. The values of these capacitors must be adjusted if it is desired to maintain the same filter shape factor at each of a plurality of center frequencies and/or filter bandwidths. After appropriate values for these capacitors are determined, any desired combination of fixed-value capacitors, equivalent transmission line sections, and/or trimmer capacitors may actually, in fact, be employed to implement the filter of FIG. 1.

Adapting the filter design of FIG. 1 for use at a plurality of center frequencies and/or bandwidths, while providing a substantially constant filter shape factor, requires a determination of capacitance values for capacitors 101, 103, 105, 107, 109, 111, 113, 115, and 117. Unfortunately, in many real-world applications, it is desirable to minimize the number of capacitance values that must be changed when adapting a filter to a new desired bandwidth and/or a new desired center frequency.

Assume, for example, that it is desired to change the bandwidth of a given filter design. In order to improve upon the prior art approach, further assume that a constraint is placed on the values of the series coupling capacitors—namely, capacitors 103 and 105—specifying that the values of these capacitors are to remain constant, irrespective of the filter center frequency and the filter bandwidth. In this manner, the number of capacitance values that must be changed is reduced. However, for these series coupling capacitors, capacitors 103 and 105, to remain constant for any center frequency or bandwidth selected, it then becomes necessary to rely upon changes in the capacitances of resonator capacitors 111, 113, and 115 and, additionally, changes in the inductances of resonator inductors 119, 121, and 123, in order to provide a desired filter frequency response. Since the capacitances of the resonator capacitors 111, 113, 115 and the inductances of the resonator inductors 119, 121, 123 are mathematically related to the filter center frequency and the filter bandwidth, it is conceivable that an adjustable-bandwidth and adjustable center frequency filter could be developed that uses fixed values for the coupling capacitors, even though such an approach has not been adopted in the prior art.

Upon further consideration, it becomes apparent that the circuit configuration of FIG. 1 cannot yield a practical filter having a tunable bandwidth as well as a tunable center frequency if the values of the coupling capacitors 103, 105 are held constant. Using any of a variety of mathematical filter analysis tools well-known to those skilled in the art, it is soon discovered that such a filter has a shape factor that varies rather significantly from one filter center frequency to another, rendering the filter unsuitable for many real-world applications such as cellular telephony. For example, a cellular telephone filter designed to have an adjustable center frequency in the range of 860–890 Mhz would exhibit substantially different performance at a center frequency of 860 Mhz than at a center frequency of 890 Mhz. The differences in performance at different center frequencies could involve changes in skirt selectivity, harmonic rejection, and/or other filter parameters. Ideally, when the center frequency of the filter is changed from 860 Mhz to 890 Mhz, only the center frequency of the filter should change, and all other filter parameters should remain substantially the same.

The circuit configuration of FIG. 1 cannot provide a filter having a characteristic that, when the center frequency is changed, all other filter parameters remain substantially the same, if the values of coupling capacitors 103, 105 are held constant. In order to keep the values of coupling capacitors 103, 105 fixed whilst, at the same time, changing the bandwidth and/or the center frequency of the filter, but not significantly changing the shape factor of the filter, the circuit configuration of FIG. 1 is entirely unsuitable.

Figure 2:
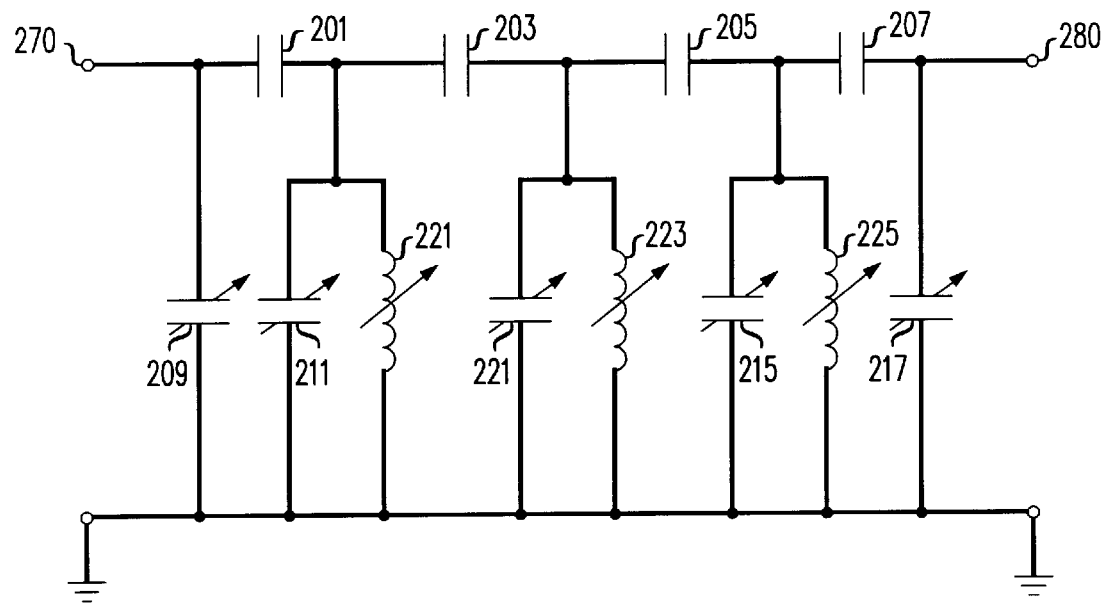
FIG. 2 is a schematic diagram of a capacitively-coupled, multi-resonator RF bandpass filter constructed according to a first illustrative embodiment of the present invention.

FIG. 2 is a schematic diagram showing an adjustable-bandwidth, adjustable center frequency filter constructed in accordance with a preferred embodiment disclosed herein. The filter configuration of FIG. 2 provides a tunable bandwidth as well as a tunable center frequency, even if the values of the coupling capacitors 203, 205 are held constant. In order to keep the values of coupling capacitors 203, 205 fixed whilst, at the same time, changing the bandwidth and/or the center frequency of the filter, the circuit configuration of FIG. 2 includes various novel features to be described below.

Referring now to FIG. 2, a first shunt capacitor 209 is provided that is in shunt between filter input terminal 270 and ground, and a second shunt capacitor 217 is provided that is in shunt between filter output terminal 280 and ground. A first series coupling capacitor 201 couples the filter input terminal 270 to filter resonator elements to be described below, and a second series coupling capacitor 207 couples the filter output terminal 280 to filter resonator elements to be described below. These first and second shunt capacitors 209, 217 must be placed at the filter input and output terminals, respectively, to maintain a substantially constant coupling impedance to filter sources and/or filter loads across a given frequency range. To this end, note that shunt capacitor 209 forms a capacitive divider with series coupling capacitor 201, and that shunt capacitor 217 forms a capacitive divider with series coupling capacitor 207.

Series coupling capacitor 201 couples the filter input terminal 270 to a first resonator element comprising a first resonator capacitor 211 and a first resonator inductor 221. Although, in the example of FIG. 2, discrete inductors and capacitors are used to implement the resonator elements, this is shown for purposes of illustration. Resonator elements could also be implemented using appropriate sections of transmission lines, for example. In such a case, a desired amount of inductance or capacitance is provided by adjusting the length of a transmission line section to an appropriate value. The first resonator element is coupled, through series coupling capacitor 203, to a second resonator element that includes second resonator capacitor 213 and second resonator inductor 223. The second resonator element is coupled, through series coupling capacitor 205, to a third resonator element that includes third resonator capacitor 215 and third resonator inductor 225. The third resonator element is coupled to the filter output terminal 280 through series coupling capacitor 207.

Note that, in the configuration of FIG. 2, capacitors 201, 203, 205, 207, 209, and 217 are shown as fixed capacitors, whereas capacitors 211, 213, and 215 are shown as variable capacitors. This does not imply that, in practice, the capacitors in question should be implemented with actual variable or fixed capacitors. Rather, as employed in FIG. 2, the variable capacitor symbol is used to indicate that the capacitances of these capacitors are changed in order to tune the filter from a first center frequency to a second center frequency, and/or to tune the filter from a first bandwidth to a second bandwidth. The fixed capacitor symbols are used to indicate that the capacitances of these capacitors are to remain constant when the filter is tuned from a first center frequency to a second center frequency, and/or tuned from a first bandwidth to a second bandwidth.

Although the schematic diagram of FIG. 2 shows discrete (lumped) capacitor and inductor elements, this is for purposes of illustration, as one or more of these discrete (lumped) elements could be replaced with a distributed element, such as a transmission line section of an appropriate impedance to provide the required inductive and/or capacitive reactance. At a given frequency, shorted transmission lines that are somewhat less than one quarter wavelength long provide inductive reactance, hence acting as an inductor. Shorted transmission lines somewhat more than a quarter wavelength long provide capacitive reactance, hence acting as a capacitor.

One technique for changing the values of inductive and/or capacitive reactance in the resonator elements of FIG. 2 is to switch any of a plurality of capacitive and/or inductive reactances into and/or out of the resonator element. For example, FETs may be used as RF switches in series with an inductive or capacitive element, thereby switching inductance and/or capacitance into and/or out of a given resonator element to achieve the desired changes in resonator element reactances.

Figure 3:
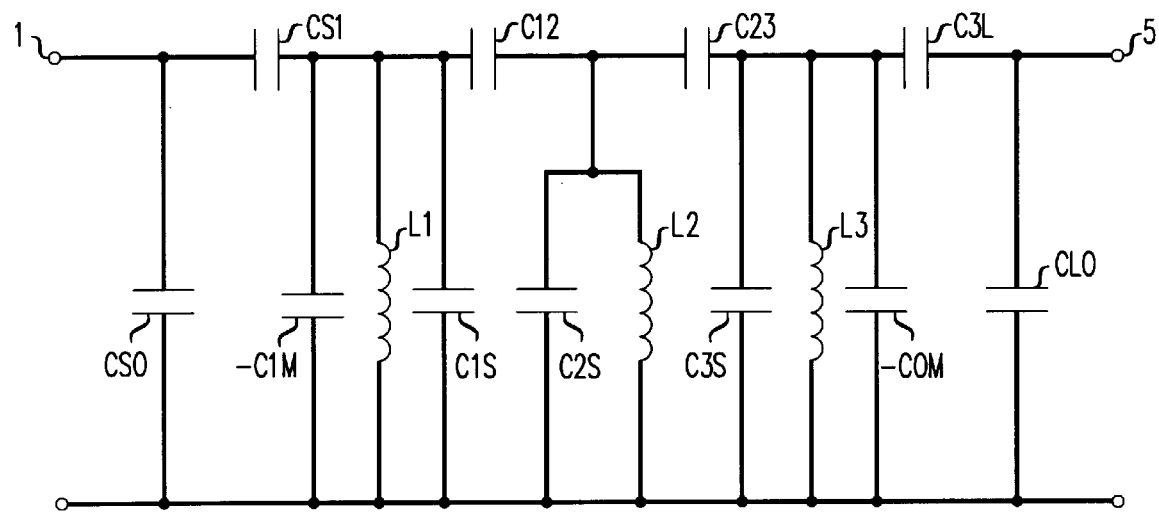
FIG. 3 is a schematic diagram of the bandpass filter of FIG. 2 redrawn for purposes of mathematical analysis.

FIG. 3 is a schematic diagram of the bandpass filter of FIG. 2 redrawn for purposes of mathematical analysis. The circuit configuration of FIG. 3 includes a first shunt capacitor, CSO, in shunt with the filter input, a second shunt capacitor, CLO, in shunt with the filter output, a third shunt capacitance C1S in parallel with a first shunt inductance L1, a fourth shunt capacitance C2S in parallel with a second shunt inductance L2, a fifth shunt capacitance C3S in parallel with a third shunt inductance L3, and four series coupling capacitors CS1, C12, C23, and C3L. For analytical purposes, two shunt capacitors, each having negative capacitance, are postulated, shown as −C1M and −C0M. In practice, discrete negative capacitance elements need not be employed to implement −C1M and −C0M, as the values of −C1M and −C0M are absorbed into the value of C1S in the case of −C1M, and C3S in the case of −C0M, as was previously shown in FIG. 2.

The circuit configuration of FIG. 3 may be mathematically analyzed to show that the circuit provides a filter having adjustable bandwidth and/or center frequency, while all other filter parameters remain substantially constant. For purposes of the analysis, the following definitions apply:

$k_{i,k}$≡the ratio of the resonant frequency of the with and kHz resonator elements to the 3dB cutoff frequency in the low-pass equivalent circuit.

$q_i$≡the quality factor of the ith resonator element, influenced by the source or load resistance, if present in parallel or in series.

$\Delta f$≡the 3dB bandwidth of the filter in Hertz (Hz)

$f_m$≡the center frequency of the filter in Hz.

$Q_o$≡the quality factor of the resonator.

The following equations are used to analyze the filter of FIG. 3. Note that the variables used in these equations were defined in the immediately preceding paragraph.

$$K_{i,k}=k_{i,k}*\Delta f/f_m \tag{1}$$

$$Q_i=q_i*f_m/\Delta f \tag{2}$$

$$C_{i,k}=K_{i,k}*(C_I*C_{II})^{1/2}, \tag{3}$$

where $C_I$ is the total nodal capacitance at a circuit node i. Note that all nodes other than node i are conceptualized as being grounded for purposes of this equation, and that $C_{II}$ is the total nodal capacitance at node k.

$$fm=1/[2*\pi*(L_i*CI)^{1/2}], \tag{4}$$

where $L_i$ is the total nodal inductance at node i.

For the configuration of FIG. 2 where capacitive coupling is used, then $L_i$ represents the inductance of the inductor in a respective resonator element.

$$Z_{s/c}=jZ_o*\tan(\beta*I)=jZ_o*\tan(2*\pi*1/\lambda), \tag{5}$$

for a shorted transmission line, where 1/λ is the length of the resonator in wavelengths. Note for 1/λ<¼, the resonator is inductive, and for 1/λ>¼, the resonator is capacitive.

$$Z_{o/c}=jZ_o*\cot(\beta*I)=-jZ_o*\cot(2*\pi*1/\lambda), \tag{6}$$

for an open transmission line, where 1/λ is the length of the resonator in wavelengths. Note for 1/λ<¼, the resonator is capacitive, and for 1/λ>¼, the resonator is inductive.

$$C_I=C1S+C12 \Rightarrow C1S=C_I-C12 \tag{7}$$

$$C_{II}=C2S+C12+C23 \Rightarrow C2S=C_{II}-C12-C23 \tag{8}$$

$$C_{III}=C3S+C23 \Rightarrow C3S=C_{III}-C23 \tag{9}$$

Since capacitive coupling is used, and all resonant elements, i.e., all nodes, resonate at the same frequency, it follows that:

$$C_I=C_{II}=C_{III}=C \tag{10}$$

$$L1=L2=L3=L \tag{11}$$

$$q_o=\Delta f/f_m*Q_o \tag{12}$$

$$C12=k_{12}*\Delta f/f_m*(C_I*C_{II})^{1/2}=k_{12}*\Delta f/f_m*C \tag{13}$$

$$C23=k_{23}*\Delta f/f_m*(CII*CII)^{1/2}=k_{23}*\Delta f/f_m*C \tag{14}$$

For C12 and C23 to remain constant for Δf and for $f_m$ movement, the nodal capacitance, C, must change; therefore, the nodal inductance must also change. Note that for a chosen filter topology $k_{i,k}$ does not change; for $k_{i,k}$ to change either the filter topology must change (i.e. Butterworth to 0.1 dB ripple Chebyshev) or the number of poles (elements) must change.

$$C \equiv f(f_m,\Delta f)=\gamma * fm/\Delta f, \tag{15}$$

where $f(f_m, \Delta f)$ is a function of $f_m$, Δf and γ is an arbitrary constant.

Using equations (7) and (15), $$C1S = C - k_{1,2}*\Delta f/f_m * C = C*[(f_m - k_{1,2}*\Delta f)/f_m] = \gamma * f_m/\Delta f * [(f_m - k_{1,2}*\Delta f)/f_m] \quad (16)$$

$$C1S = \gamma*(f_m/\Delta f - k_{1,2}) \quad (17)$$

Similarly, for C2S and C3S, $$C2S = \gamma*(f_m/\Delta f - k_{1,2} - k_{2,3}) \quad (18)$$

$$C3S = \gamma*(f_m/\Delta f - k_{2,3}) \quad (19)$$

Equations (17)→(19) place boundaries on realizable values of C1S→C3S, $$f_m/\Delta f \geq k_{1,2} + k_{2,3} \quad (20)$$

Practically, $f_m/\Delta f$ must be greater than the value given in (22), because of parasitic capacitances and manufacturability reasons.

From equations (4) and (15), $$1/(L*C) = (2*\pi)^2*(f_m)^2 \quad (21)$$

$$L = 1/[C*(2*\pi)^2*(f_m)^2] = 1/[\gamma*(f_m/\Delta f*(2*\pi)^2*(f_m)^2] \quad (22)$$

$$L = \Delta f/[\gamma*(2*\pi)^2*(f_m)^3] \quad (23)$$

Equations (14), (17)→(19), and (23) provide some insight into the required "metamorphosis" in the resonator.

A) The total nodal capacitance is a linear function of the center frequency ($f_m$) and is a linear function of $1/\Delta f$ ($\Delta f$ is the 3dB bandwidth) as required by the stipulation to keep the series capacitors constant with $\Delta f$ and $f_m$.

B) The total nodal inductance (same as the resonator inductance in this case) is a linear function of the 3dB bandwidth ($\Delta f$) and a cubic function of $1/f_m$.

C) The resonator capacitance is a linear function of $f_m$ and $1/\Delta f$, just as the nodal capacitance, only a constant $\gamma * \Sigma (k_{i,k})$ separates the two.

If the "L" and "C" in the resonator are to be realized with open or shorted transmission lines, the lengths of those lines for various center frequencies and bandwidths must be determined. Using equations (5), (6), (17)→(19), and (23);

$$\omega_m*L = Z_o*tan(2*\pi|1/\lambda), \text{ for a shorted line of length, } 0<|1<\lambda/4, \text{ or an open line of length, } \lambda/4<(|1+\lambda/4)<\lambda/2. \quad (24)$$

$$\omega_m*C = (1/Z_o)*tan(2*\pi|1/\lambda), \text{ for an open line of length, } 0<|1<\lambda/4, \text{ or a shorted line of length, } \lambda/4<(|1+\lambda/4)<\lambda/2. \quad (25)$$

To verify the foregoing mathematical analysis, three different filter topologies were simulated using a software package well-known to those skilled in the art as the Eagleware™ RF linear simulator. The center frequencies bandwidths, required nodal capacitances and inductances, given in Table 1 below, can be obtained from the equations presented above.

TABLE 1

Center Frequencies, Bandwidths, Nodal Capacitances and Inductances for RF Simulations

| | | | |
|---|---|---|---|
| $f_m$ (MHz) | 838 | 1880 | 2444 |
| $\Delta f$ (MHz) | 25 | 60 | 84 |
| $f_m/\Delta f$ | 33.52 | 31.33 | 29.10 |
| C (pF) | 5.03 | 4.70 | 4.36 |
| L (nH) | 7.17 | 1.52 | 0.97 |

Figure 5A:
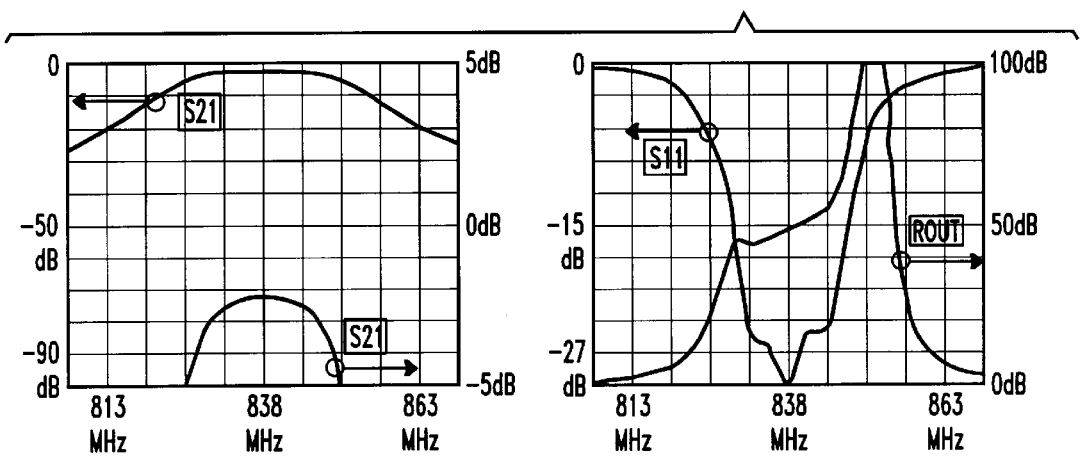
FIG. 5A, 5B, and 5C are graphs setting forth S (scattering) paremeters for the filter design of FIG. 2 at three different center frequencies.
Figure 5B:
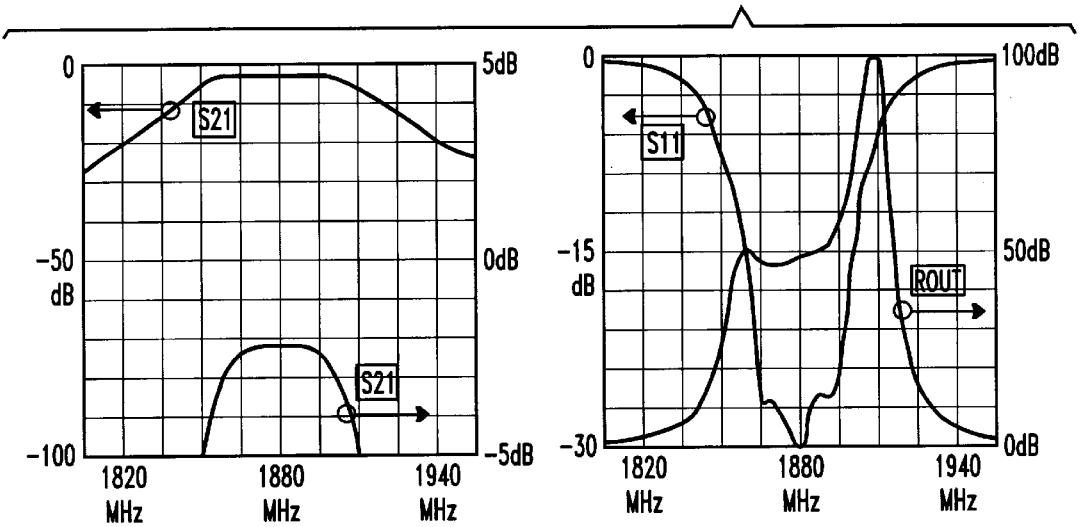
Figure 5C:
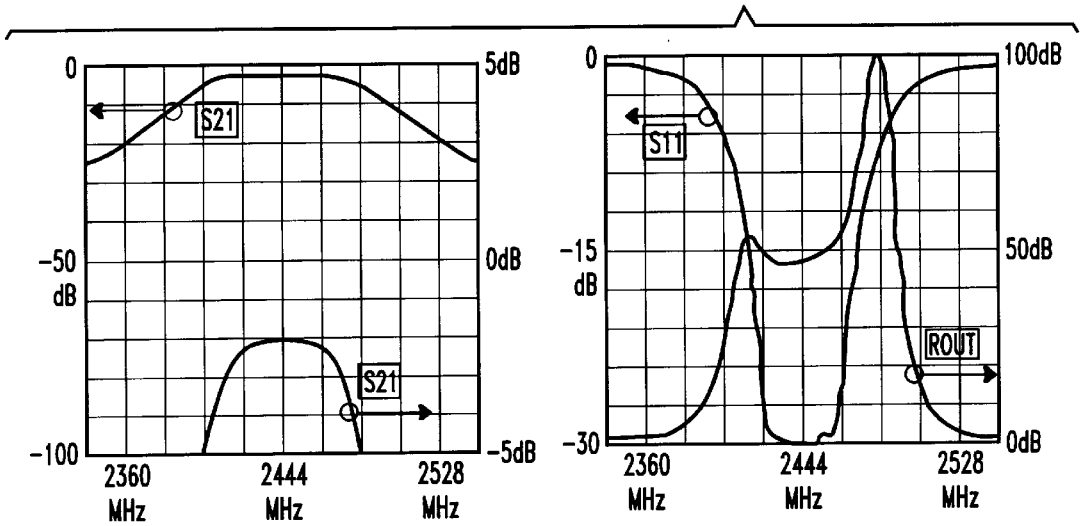

A filter was constructed in accordance with the values of TABLE 1 and using the circuit topology of FIG. 2. The resonating capacitors 211, 213, 215 (FIG. 2) of the filter were adjusted so as to provide a filter having a center frequency of 838 Mhz, selected parameters of which are shown in the corresponding column of TABLE 1. S parameters for the 838-Mhz filter, as determined by the aforementioned Eagleware™ simluator, are shown in FIG. 5A. Next, the resonating capacitors 211, 213, 215 (FIG. 2) were adjusted so as to provide a filter having a center frequency of 1880 Mhz, selected parameters of which are shown in the corresponding column of TABLE 1. S parameters for the 1880-Mhz filter, as determined by the Eagleware™ simluator, are shown in FIG. 5B. Finally, the resonating capacitors were adjusted so as to provide a filter having a center frequency of 2444 Mhz, selected parameters of which are shown in the corresponding column of TABLE 1. S parameters for the 2444-Mhz filter, as determined by the Eagleware™ simluator, are shown in FIG. 5C. It is important to note that the shapes of respective S parameter curves at 838 Mhz are virtually identical to the corresponding curves at 1880 Mhz and also at 2444 Mhz. In particular, the curves for $S_{21}$, indicative of the frequency response of the filter, have a 3-dB bandwidth (mathematically denoted above by $\Delta f$) that remains virtually constant from one center frequency to another.

Figure 4:
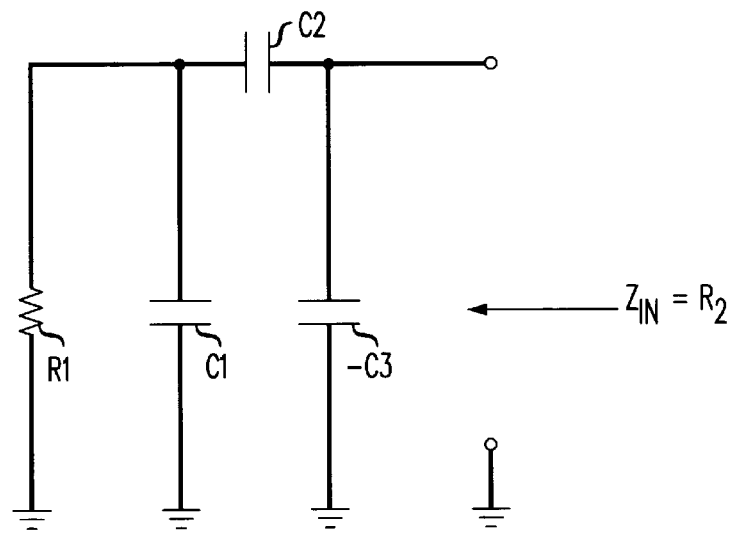
FIG. 4 is a schematic diagram showing an illustrative technique for determining filter input and/or output impedances.

For the filter to be tunable and for the coupling capacitors to be constant, the following considerations apply. The two coupling capacitors CS1, C3L of FIG. 3 provide a reactance that changes with frequency, thereby causing load and source coupling to the filter to vary with frequency. To keep load and source coupling to the filter at a relatively constant level as the center frequency and/or bandwidth are changed or "tuned", a capacitor CSO from the input node (input terminal) to ground is incorporated into the design of FIG. 3. Another capacitor CL0 is used from the output node (output terminals) to ground. These shunt capacitors CS0 and CL0 allow the coupling capacitors CS1, C12, C23, and C3L to remain constant, while the capacitances of capacitors CS0, C1S, C2S, C3S, and CL0 must be adjusted as the center frequency and bandwidth is changed or "tuned". Refer to FIG. 4, to be described below for further mathematical derivations.

Some points to note:

all of the series capacitors, namely, capacitors CS1, C12, C23 and C3L remain at the same value for the three different center frequencies and bandwidths set forth in TABLE 1 (within roundoff error.)

both the shunt C's and the shunt L's, namely, capacitors CS0, C1S, C2S, C3S and CL0, and inductors L1, L2, and L3 must change in value for the different center frequencies and bandwidths, with the L's having to change over a 7.0:1 ratio and the C's changing by a ratio of less than 1.9:1.

the filters are able to maintain the same shape or filter type as they are "tuned".

Practical Implementation

An implementation of the filter in FIG. 2 will use some type of mechanism for tuning the shunt L's (inductors 221, 223, 225) and the shunt C's (capacitors 209, 211, 213, 215, 217). Although any of several techniques well-known to those skilled in the art could be employed for this purpose (i.e., varactor diodes, etc), one illustrative approach uses tunable transmission line sections to implement one or more of the shunt C's and/or shunt L's. As discussed previously, shorted transmission line sections less than one quarter wavelength at the center frequency provide inductive reactance, whereas shorted transmission line sections greater than one quarter wavelength at the center frequency provide capacitive reactance. RF switches from the center conductor (i.e., the hot conductor and/or the conductor that is not at RF ground potential) of a respective transmission line section to ground, such as FET switches, may be provided at several appropriate locations along a given transmission line. These FETs are switched on and/or off, thereby changing the capacitance and inductance of the shunt elements, and changing the center frequency and/or bandwidth of the filter to a desired value.

With reference to FIG. 4, it is desired that the input impedance, $Z_{in}$, be equal to R2. Mathematically, set $$Z_{in}=(1+j\omega*R1*C1+j\omega R1*C2)/(j\omega*C2-j\omega*C3-\omega^2*R1*C1*C2+\omega^2*R1*C1*C3+\omega^2*R1*C2*C3)=R2 \quad \text{(Equation A1)}$$

The imaginary term of Equation A1 must equal zero; therefore, $$\omega*R1*C1+\omega*R1*C2=\omega*R2*C2-\omega*R2*C3 \quad \text{(Equation A2)}$$

Again, it is desired that the coupling capacitor be constant regardless of the R1 and R2 value; this (R1→R2) is the impedance transformation that occurs by varying only the shunt values of capacitance, when the center frequency or the bandwith changes. Using this fact and rewriting Equation A2, $$C2=k=(R1*C1+R2*-C3)/(R2-R1) \quad \text{(Equation A3)}$$

Rewriting Equation A3, $$C1=(R2/R1)*[C3-k*(R1/R2-1)] \quad \text{(Equation A4)}$$

Using Equation A4 and setting the real terms of Equation A1 to R2 provides, $$-1=\omega^2*R1*R2*(C1*C2-C1*C3-C2*C3) \quad \text{(Equation A5)}$$

Substituting, C2=k and Equation A4 into Equation A5 and manipulating the terms provides, $$-1=\omega^2*R2^{2}*[-k*C3+k^2*(R1/R2-1)+C3^2-k*C3*(R1/R2-1)-k*R1/R2*C3] \quad \text{(Equation A6)}$$

Rewriting Equation A6 provides, $$C3^2-C3*2*k+[1/(\omega^2*R2^2)-k^2*(R1/R2-1)]=0 \quad \text{(Equation A7)}$$

Taking only the negative root (C2>C3) to Equation A7 provides, $$C3=k*\{[-(\omega^2*k^2*R1*R2-1)^{1/2}/(\omega*R2*k)]+1\} \quad \text{(Equation A8)}$$

From Equations A8, A4 and A3, the capacitive transformer equations are solved.

What is claimed:

1. An RF filter having an input terminal, an output terminal, a plurality of resonator elements, and a plurality of fixed coupling reactances for coupling one resonator element to another resonator element, for coupling the input terminal to a resonator element, and for coupling the output terminal to a resonator element, CHARACTERIZED IN THAT the RF filter provides a tunable center frequency across a specified frequency range by only tuning one or more of the resonator elements, wherein normalized frequency response of the filter relative to the center frequency remains substantially constant over the specified frequency range.

2. The Rf filter of claim 1 further characterized in that the filter includes a first shunt reactance shunted across the input terminal and ground, and a second shunt capacitive reactance shunted across the output terminal impedance match the RF filter.

3. An RF filter having an input terminal, an output terminal, a plurality of resonator elements, and a plurality of fixed coupling reactances for coupling one resonator element to another resonator element, for coupling the input terminal to a resonator element, and for coupling the output terminal to a resonator element, CHARACTERIZED IN THAT the RF filter provides a tunable center frequency across a specified frequency range by only tuning one or more of the resonator elements, wherein the frequency response of the filter relative to the center frequency changes over the specified frequency range in accordance with a set of desired design parameters.

4. An RF filter having an input terminal, an output terminal, a plurality of tunable resonator elements, and a plurality of fixed coupling reactances for coupling one resonator element to another resonator element, for coupling the input terminal to a resonator element, and for coupling the output terminal to a resonator element, CHARACTERIZED IN THAT the RF filter provides a tunable bandwidth in a specified range of bandwidths wherein shape of the bandwidth-normalized frequency response curve of the filter relative to bandwidth remains substantially constant over the specified range of bandwidths by only tuning one or more of the resonator elements, thereby providing a filter having a substantially constant shape factor across the specified range of bandwidths.

5. The RF filter of claim 4 further including a first shunt reactance shunted across the input terminal and ground, and a second shunt reactance shunted across the output terminal and ground.

6. The RF filter of claim 4 further including a first shunt capacitive reactance shunted across the input terminal and ground, and a second shunt capacitive reactance shunted across the output terminal and ground.

7. An RF filter having an input terminal, an output terminal, a plurality of tunable resonator elements, and a plurality of fixed coupling reactances for coupling one resonator element to another resonator element, for coupling the input terminal to a resonator element, and for coupling the output terminal to a resonator element, CHARACTERIZED IN THAT the RF filter provides a tunable center frequency across a specified frequency range and a tunable bandwidth in a specified range of bandwidths by only tuning one or more of the resonator elements, wherein the shape of the frequency response curve of the filter relative to the center frequency remains substantially constant over the specified frequency range, and the shape of the frequency response curve of the filter relative to bandwidth remains substantially constant over the specified range of bandwidths, thereby providing a filter having a shape factor that remains substantially constant over the specified frequency range and over the specified range of bandwidths.

8. The RF filter of claim 7 further including a first shunt reactance shunted across the input terminal and ground, and a second shunt reactance shunted across the output terminal and ground.

9. The RF filter of claim 7 further including a first shunt capacitive reactance shunted across the input terminal and ground, and a second shunt capacitive reactance shunted across the output terminal and ground.

10. A method for use with an RF filter having an input terminal, an output terminal, a plurality of tunable resonator elements, and a plurality of fixed coupling reactances for coupling one resonator element to another resonator element, for coupling the input terminal to a resonator element, and for coupling the output terminal to a resonator element, the method CHARACTERIZED BY the steps of:

(a) adjusting the RF filter to a first center frequency by only adjusting one or more of the resonator elements; and (b) adjusting the RF filter to a second center frequency by only adjusting one or more of the resonator elements; wherein normalized frequency response of the filter remains substantially constant from the first center frequency to the second center frequency.

11. A method for use with an RF filter having an input terminal, an output terminal, a plurality of tunable resonator elements, and a plurality of fixed coupling reactances for coupling one resonator element to another resonator element, for coupling the input terminal to a resonator element, and for coupling the output terminal to a resonator element, the method CHARACTERIZED BY the steps of:

(a) adjusting the RF filter to a first bandwidth by only adjusting at least one of the resonator elements; and (b) adjusting the RF filter to a second bandwidth by only adjusting at least one of the resonator elements; wherein normalized frequency response of the filter remains substantially constant from the first bandwidth to the second bandwidth.

12. A method for use with an RF filter having an input terminal, an output terminal, a plurality of tunable resonator elements, and a plurality of fixed coupling reactances for coupling one resonator element to another resonator element, for coupling the input terminal to a resonator element, and for coupling the output terminal to a resonator element, the method CHARACTERIZED BY the steps of:

(a) adjusting the RF filter to a first center frequency by only adjusting at least one of the resonator elements;

(b) adjusting the RF filter to a second center frequency by only adjusting at least one of the resonator elements; wherein a normalized frequency response of the filter remains substantially constant from the first center frequency to the second center frequency;

(c) adjusting the RF filter to a first bandwidth by only adjusting at least one of the resonator elements; and (d) adjusting the RF filter to a second bandwidth by only adjusting at least one of the resonator elements; wherein a normalized frequency response of the filter remains substantially constant from the first bandwidth to the second bandwidth;

and wherein said steps (a), (b), (c) and (d) are performed in any order.

13. A method for use with an RF filter having an input terminal, an output terminal, a plurality of tunable resonator elements, and a plurality of fixed coupling reactances for coupling one resonator element to another resonator element, for coupling the input terminal to a resonator element, and for coupling the output terminal to a resonator element, a first shunt reactance in shunt across the input terminal and ground, and a second shunt reactance in shunt across the output terminal and ground, the method CHARACTERIZED BY the steps of:

(a) adjusting the RF filter to a first center frequency by only adjusting one or more of the resonator elements; and (b) adjusting the RF filter to a second center frequency by only adjusting one or more of the resonator elements; wherein normalized frequency response of the filter remains substantially constant from the first center frequency to the second center frequency.

14. The method of claim 13 further including the step of providing an RF filter wherein the first and second shunt reactances are capacitive reactances.

15. A method for use with an RF filter having an input terminal, an output terminal, a plurality of tunable resonator elements, and a plurality of fixed coupling reactances for coupling one resonator element to another resonator element, for coupling the input terminal to a resonator element, and for coupling the output terminal to a resonator element, a first shunt reactance shunted across the input terminal and ground, and a second shunt reactance shunted across the output terminal and ground, the method CHARACTERIZED BY the steps of:

(a) adjusting the RF filter to a first bandwidth by only adjusting one or more of the resonator elements; and (b) adjusting the RF filter to a second bandwidth by only adjusting one or more of the resonator elements; wherein bandwidth-normalized frequency response of the filter remains substantially constant from the first bandwidth to the second bandwidth.

16. The method of claim 15 further including the step of providing an RF filter wherein the first and second shunt reactances are capacitive reactances.

17. A method for use with an RF filter having an input terminal, an output terminal, a plurality of tunable resonator elements, and a plurality of fixed coupling reactances for coupling one resonator element to another resonator element, for coupling the input terminal to a resonator element, and for coupling the output terminal to a resonator element, a first shunt reactance shunted across the input terminal and ground, and a second shunt reactance shunted across the output terminal and ground, the method CHARACTERIZED BY the steps of:

(a) adjusting the RF filter to a first center frequency by only adjusting one or more of the resonator elements;

(b) adjusting the RF filter to a second center frequency by only adjusting one or more of the resonator elements; wherein normalized frequency response of the filter remains substantially constant from the first center frequency to the second center frequency;

(c) adjusting the RF filter to a first bandwidth by only adjusting one or more of the resonator elements; and (d) adjusting the RF filter to a second bandwidth by only adjusting one or more of the resonator elements; wherein normalized frequency response of the filter remains substantially constant from the first bandwidth to the second bandwidth;

and wherein steps (a), (b), (c), and (d) are performed in any order.

18. The method of claim 17 further including the step of providing an RF filter wherein the first and second shunt reactances are capacitive reactances.

19. A method for use with an RF filter having an input terminal, an output terminal, a plurality of tunable resonator elements, and a plurality of fixed coupling reactances for coupling one resonator element to another resonator element, for coupling the input terminal to a resonator element, and for coupling the output terminal to a resonator element, the method CHARACTERIZED BY the steps of:

(a) providing an RF filter that is adjustable to a first center frequency, and to a second center frequency, by only adjusting at least one of the resonator elements; and (b) providing such an RF filter wherein normalized frequency response of the filter remains substantially constant from the first center frequency to the second center frequency.

20. A method for use with an RF filter having an input terminal, an output terminal, a plurality of tunable resonator elements, and a plurality of fixed coupling reactances for coupling one resonator element to another resonator element, for coupling the input terminal to a resonator element, and for coupling the output terminal to a resonator element, the method CHARACTERIZED BY the steps of:

(a) providing an RF filter that is adjustable to a first bandwidth, and to a second bandwidth, by only adjusting at least one of the resonator elements; and (b) providing such an RF filter wherein normalized frequency response of the filter remains substantially constant from the first bandwidth to the second bandwidth.

21. A method for use with an RF filter having an input terminal, an output terminal, a plurality of tunable resonator elements, and a plurality of fixed coupling reactances for coupling one resonator element to another resonator element, for coupling the input terminal to a resonator element, and for coupling the output terminal to a resonator element, the method CHARACTERIZED BY the steps of:

(a) providing an RF filter that is adjustable to a first center frequency, and to a second center frequency, by only adjusting at least one of the resonator elements; wherein the normalized frequency response of the filter, relative to center frequency, remains substantially constant from the first center frequency to the second center frequency; and (b) providing such an RF filter that is adjustable to a first bandwidth, and to a second bandwidth, by only adjusting at least one of the resonator elements; wherein the frequency response of the filter, relative to bandwidth, remains substantially constant from the first bandwidth to the second bandwidth.

22. A method for use with an RF filter having an input terminal, an output terminal, a plurality of tunable resonator elements, and a plurality of fixed coupling reactances for coupling one resonator element to another resonator element, for coupling the input terminal to a resonator element, and for coupling the output terminal to a resonator element, a first shunt reactance shunted across the input terminal and ground, and a second shunt reactance shunted across the output terminal and ground, the method CHARACTERIZED BY the steps of:

(a) providing an RF filter adjustable to a first center frequency, and to a second center frequency, by only adjusting one or more of the resonator elements; and (b) providing such an RF filter wherein the frequency response of the filter, relative to center frequency, remains substantially constant from the first center frequency to the second center frequency.

23. The method of claim 22 further including the step of providing an RF filter wherein the first and second shunt reactances are capacitive reactances.

24. A method for use with an RF filter having an input terminal, an output terminal, a plurality of tunable resonator elements, and a plurality of fixed coupling reactances for coupling one resonator element to another resonator element, for coupling the input terminal to a resonator element, and for coupling the output terminal to a resonator element, a first shunt reactance shunted across the input terminal and ground, and a second shunt reactance shunted across the output terminal and ground, the method CHARACTERIZED BY the steps of:

(a) providing an RF filter that is adjustable to a first bandwidth, and to a second bandwidth, by only adjusting one or more of the resonator elements; and (b) providing such an RF filter wherein the frequency response of the filter, relative to bandwidth, remains substantially constant from the first bandwidth to the second bandwidth.

25. The method of claim 24 further including the step of providing an RF filter wherein the first and second shunt reactances are capacitive reactances.

26. A method for use with an RF filter having an input terminal, an output terminal, a plurality of tunable resonator elements, and a plurality of fixed coupling reactances for coupling one resonator element to another resonator element, for coupling the input terminal to a resonator element, and for coupling the output terminal to a resonator element, a first shunt reactance shunted across the input terminal and ground, and a second shunt reactance from the output terminal to ground, the method CHARACTERIZED BY the steps of:

(a) providing an RF filter adjustable to a first center frequency, and to a second center frequency, by only adjusting one or more of the resonator elements; wherein the normalized frequency response of the filter, relative to center frequency, remains substantially constant from the first center frequency to the second center frequency; and (b) providing such an RF filter adjustable to a first bandwidth, and to a second bandwidth, by only adjusting one or more of the resonator elements; wherein the frequency response of the filter, relative to bandwidth, remains substantially constant from the first bandwidth to the second bandwidth.

27. The method of claim 26 further including the step of providing an RF filter wherein the first and second shunt reactances are capacitive reactances.

28. A method of implementing a tunable filter including a plurality of tunable resonators, each resonator including a plurality of shunt reactive elements, said method comprising:

a) coupling said resonators in series with substantially fixed-value capacitors; and b) varying the reactances of said shunt reactive elements to tune the filter to any of a plurality of center frequencies in a specified range of frequencies, such that the filter provides a substantially constant frequency response, relative to center frequency, at said plurality of different center frequencies.

* * * * *